(12) United States Patent
Wu

(10) Patent No.: US 7,298,620 B2
(45) Date of Patent: Nov. 20, 2007

(54) HEAT DISSIPATION DEVICE

(75) Inventor: Yi-Qiang Wu, Guangdong (CN)

(73) Assignees: Fu Zhun Precision Industry (Shen Zhen) Co., Ltd., Longhue Town, Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 102 days.

(21) Appl. No.: 11/164,860

(22) Filed: Dec. 8, 2005

(65) Prior Publication Data

US 2007/0133175 A1 Jun. 14, 2007

(51) Int. Cl.
*H05K 7/20* (2006.01)

(52) U.S. Cl. .............. 361/700; 361/699; 361/702; 361/703; 165/80.4; 165/80.5

(58) Field of Classification Search ........ 361/699–712, 361/714, 719, 784, 785; 165/80.3, 80.4, 165/104.14, 104.26, 104.33, 121, 122; 257/714, 257/715; 174/15.2, 163; 62/259.2
See application file for complete search history.

(56) References Cited

U.S. PATENT DOCUMENTS

| 5,381,859 | A | * | 1/1995 | Minakami et al. ......... 165/80.3 |
| 5,535,816 | A | * | 7/1996 | Ishida ..................... 165/80.3 |
| 6,137,682 | A | * | 10/2000 | Ishimine et al. ............ 361/704 |
| 6,478,082 | B1 | * | 11/2002 | Li .............................. 165/185 |
| 6,917,522 | B1 | * | 7/2005 | Erturk et al. ............... 361/700 |
| 6,945,319 | B1 | * | 9/2005 | Li et al. ................. 165/104.33 |
| 7,124,806 | B1 | * | 10/2006 | Wang et al. ............... 165/80.3 |
| 2001/0001981 | A1 | | 5/2001 | Ueda et al. |
| 2004/0226697 | A1 | * | 11/2004 | Liu ....................... 165/104.33 |
| 2005/0133199 | A1 | * | 6/2005 | Lo ............................ 165/80.3 |
| 2006/0144572 | A1 | * | 7/2006 | Yu et al. ................ 165/104.33 |

FOREIGN PATENT DOCUMENTS

| TW | M243912 | 9/2004 |
| TW | M261012 | 4/2005 |

* cited by examiner

*Primary Examiner*—Michael Datskovskiy
(74) *Attorney, Agent, or Firm*—Winston Hsu

(57) ABSTRACT

A heat dissipation device for dissipating heat from an electronic device comprises a base, a heat dissipation member provided with two heat-dissipating plate groups intercrossed with each other and defining a plurality of air passages. At least a heat pipe connects the base with the heat dissipation member to transfer heat from the base to the heat dissipation member. A first heat sink and a second heat sink respectively contact with lateral sides of the heat dissipation member. The heat pipe is partly sandwiched between the heat dissipation member and the first and second heat sinks.

19 Claims, 4 Drawing Sheets

US 7,298,620 B2

HEAT DISSIPATION DEVICE

FIELD OF THE INVENTION

The present invention relates to a heat dissipation device, and particularly to a heat dissipation device for an integrated circuit package.

DESCRIPTION OF RELATED ART

Continuing development of integrated circuit technology has rendered integrated circuit packages (IC packages) such as central processing units (CPUs) to operate at a higher and higher speed. Heat generated by these modern IC packages has increased commensurately. Accumulation of heat will result in an increasing of temperature of the IC packages, and consequently result in instability of operation or even damage of the IC packages. For above reason, the heat must be efficiently removed in order to maintain a normal operation of the IC packages.

Various heat sink configurations for heat dissipation of IC packages are developed. Along with continuous increase of heat-generating, conventional heat sinks dissipating heat merely by natural metal thermal conduction have not met the requirement of heat dissipation of the heat-generating IC packages. In recent years, heat pipes have been widely used due to their fast heat-transferring capacity. Accordingly, heat sinks using heat pipes are more and more popular.

A typical heat sink with heat pipes is shown in FIG. 4. Referring to FIG. 4, the heat sink has a base 100, two vertical U-shaped heat pipes 200 installed on the base 100 and a plurality of parallel fins 300 through which the heat pipes 200 extend. The heat sink absorbs heat generated by an IC package (not shown) by the base 100. The heat on the base 100 is speedily transferred, via the heat pipes 200, to the fins 300 for further heat dissipation to avoid overheating of the IC package.

To maximize heat dissipation surface area, the fins are made to have large sizes, however, a heat pipe 200 usually has a small diameter. So, contacting area between the heat pipes and the fins is not enough to establish a satisfactory heat connection. On the other hand, each large-sized fin is supported by the heat pipes only at several points and all the fins are isolated to each other. The fins 300 cannot have a robust structure. When a fan is used for providing a forced airflow through the fins 300 to facilitate heat removal, vibration and noise generated by the fins 300 are unavoidable. The vibration will be partly transferred to the base 100 of the heat sink and even to the IC package, thereby adversely impacting normal operation of the IC package, such as stability or life span thereof. The noise is more considerable and insufferable when a resonant vibration occurs. So it is necessary to improve the heat sink to remove said disadvantage and gain a high heat dissipation performance.

Therefore, it is desired to evolve a heat dissipation device to overcome above-mentioned problems.

SUMMARY OF INVENTION

Accordingly, what is needed is a heat dissipation device having a strong structure and a high heat dissipation performance.

A heat dissipation device in accordance with a preferred embodiment of the present invention comprises a base, a heat dissipation member comprising two heat-dissipating plate groups intercrossed with each other so as to define a plurality of passages arranged in a matrix having a plurality of rows and columns, and a heat pipe connecting the base with the heat dissipation member to transfer heat from the base to the heat dissipation member. A first heat sink and a second heat sink cooperate with the heat dissipation member and sandwich the heat dissipation member therebetween.

Other advantages and novel features of the present invention will become more apparent from the following detailed description when taken in conjunction with the accompanying drawings, in which:

DETAILED DESCRIPTION

Figure 1:
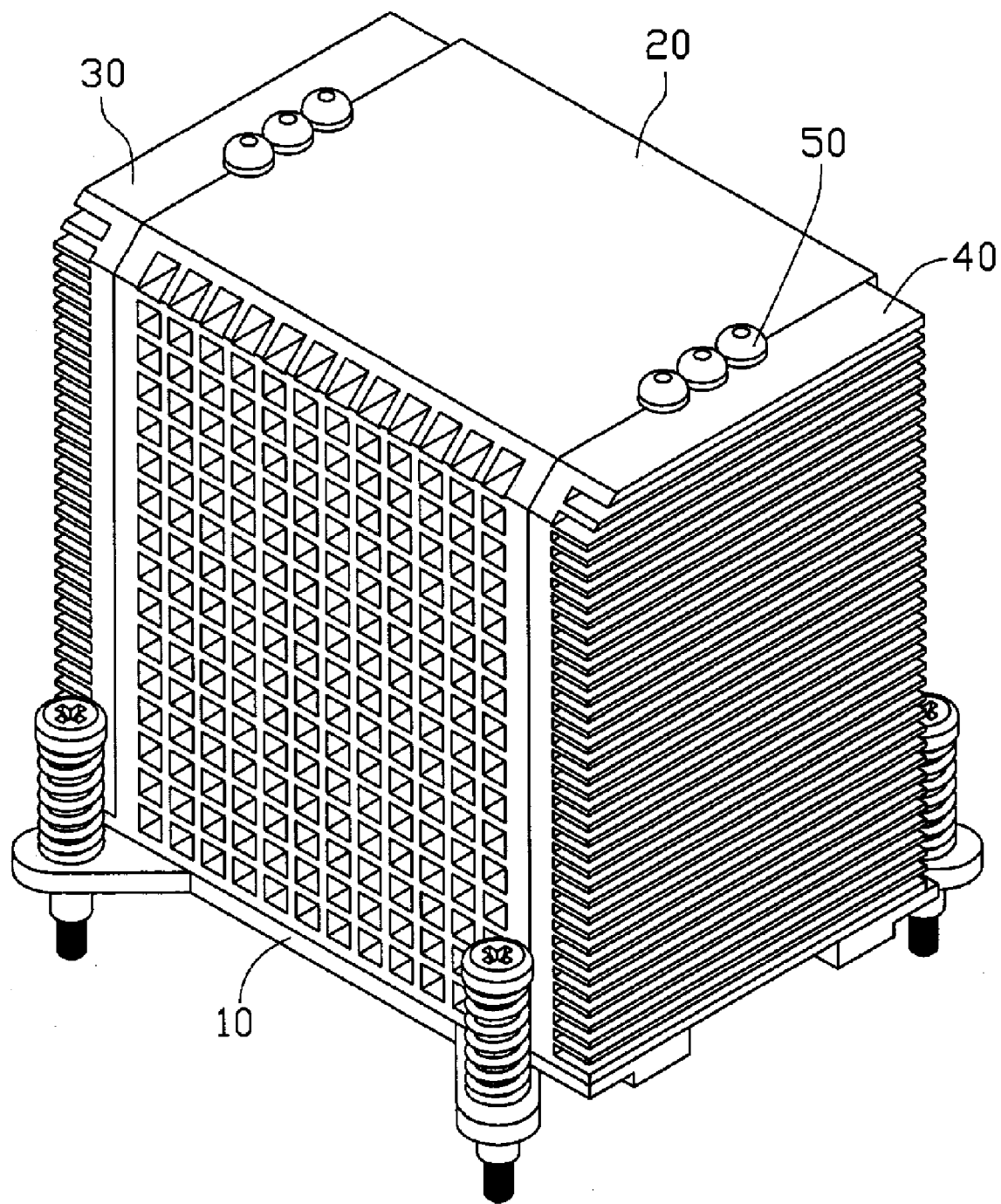
FIG. 1 is an isometric view of a heat dissipation device in accordance with a preferred embodiment of the present invention.

Reference will now be made to the drawing figures to describe a heat dissipation device in accordance with a preferred embodiment of the present invention.

Figure 3:
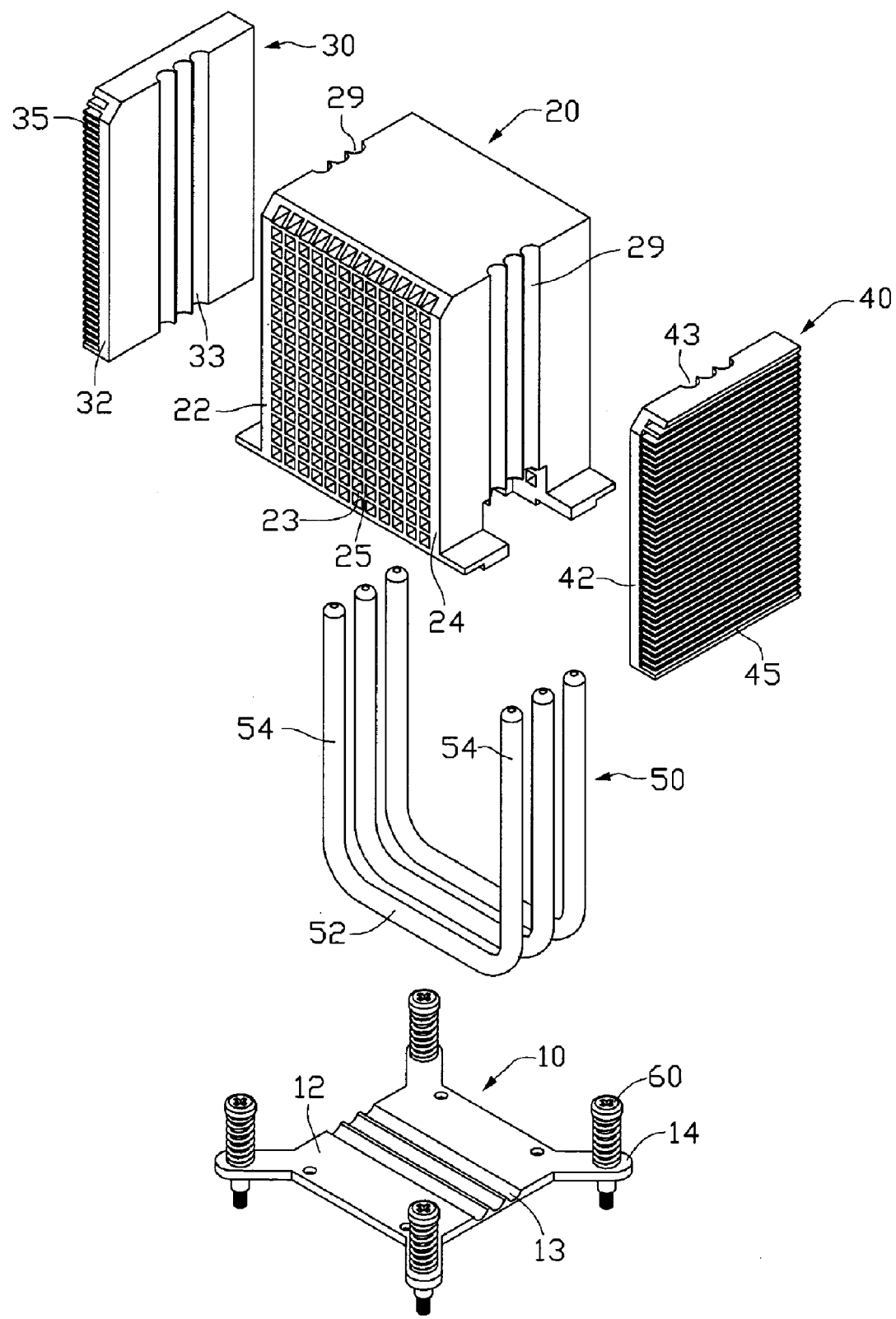
FIG. 3 is an exploded view of FIG. 1.
Figure 4:
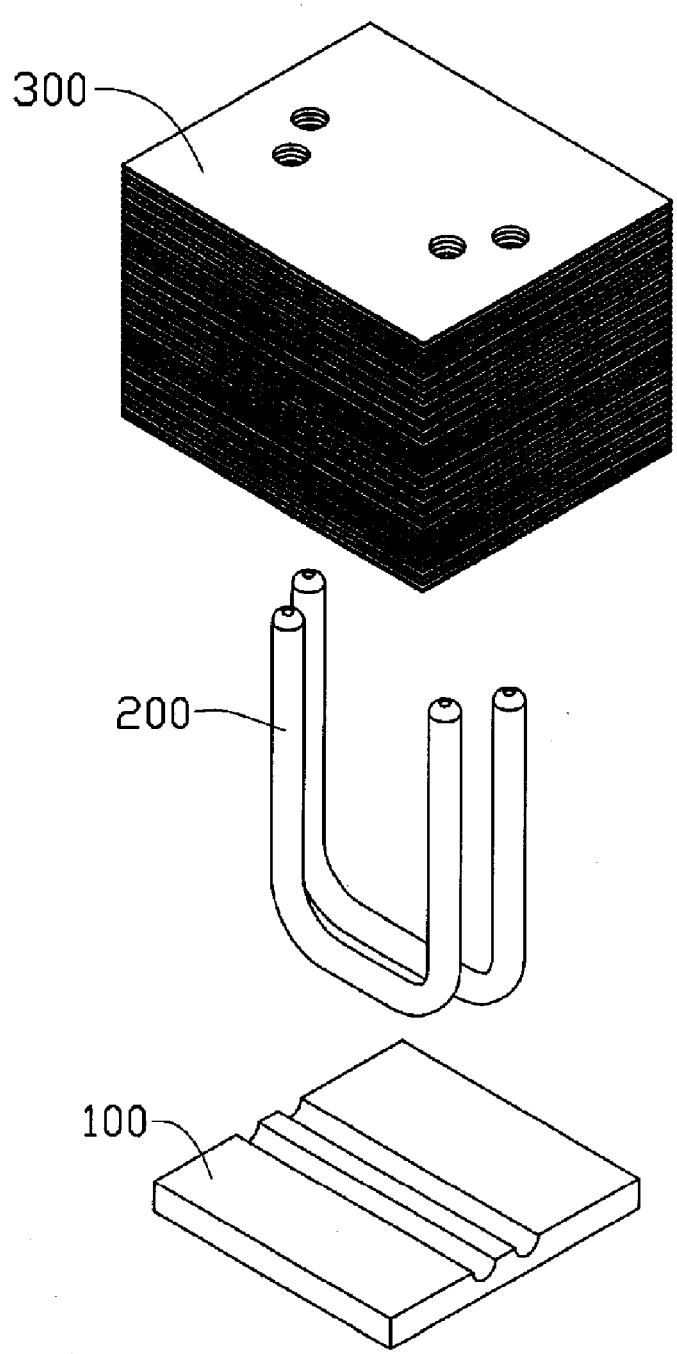
FIG. 4 is an exploded, isometric view of a conventional heat dissipation device.

The heat dissipation device is for being mounted to an heat-generating electronic device, such as an IC package (not shown), to dissipate heat therefrom. Referring to FIGS. 1 and 3, the heat dissipation device comprises a base 10 for contacting the electronic device to absorb heat therefrom, a heat dissipation member 20 for dissipating heat, three U-shaped heat pipes 50 connecting the heat dissipation member 20 with the base 10 for transferring heat from the base to the heat dissipation member 20. A first heat sink 30 and a second heat sink 40 are respectively connected to two lateral sides (not labeled) of the heat dissipation member 20 and sandwich the heat dissipation member 20 therebetween.

The base 10, generally being made of cooper and a rectangle flat plate, has a bottom face (not shown) for contacting the electronic device, and a top face 12 which is opposite to the bottom face and define three parallel grooves 13 therein. Four fixing legs 14, each defining a mounting hole (not labeled), extend respectively from four corners of the base 10. Bolts 60 with springs (not labeled) thereon extend through the holes of the fixing legs 14 for securing the heat dissipation device to a substrate (not shown) on which the electronic device is mounted.

The heat pipes 50 each comprise an evaporating portion 52 received in a corresponding groove 13 of the base 10 and two parallel condensing portions 54 extending perpendicularly upwardly from opposite ends of the evaporating portion 52. The evaporating portions 52 are thermally connected with the base 10 and a bottom of the heat dissipation member 20 when the base 10, the heat dissipation member 20 and the heat pipes 50 are assembled together. The condensing portions 54 of each heat pipe 50 extend away from and perpendicular to the base 10.

Figure 2:
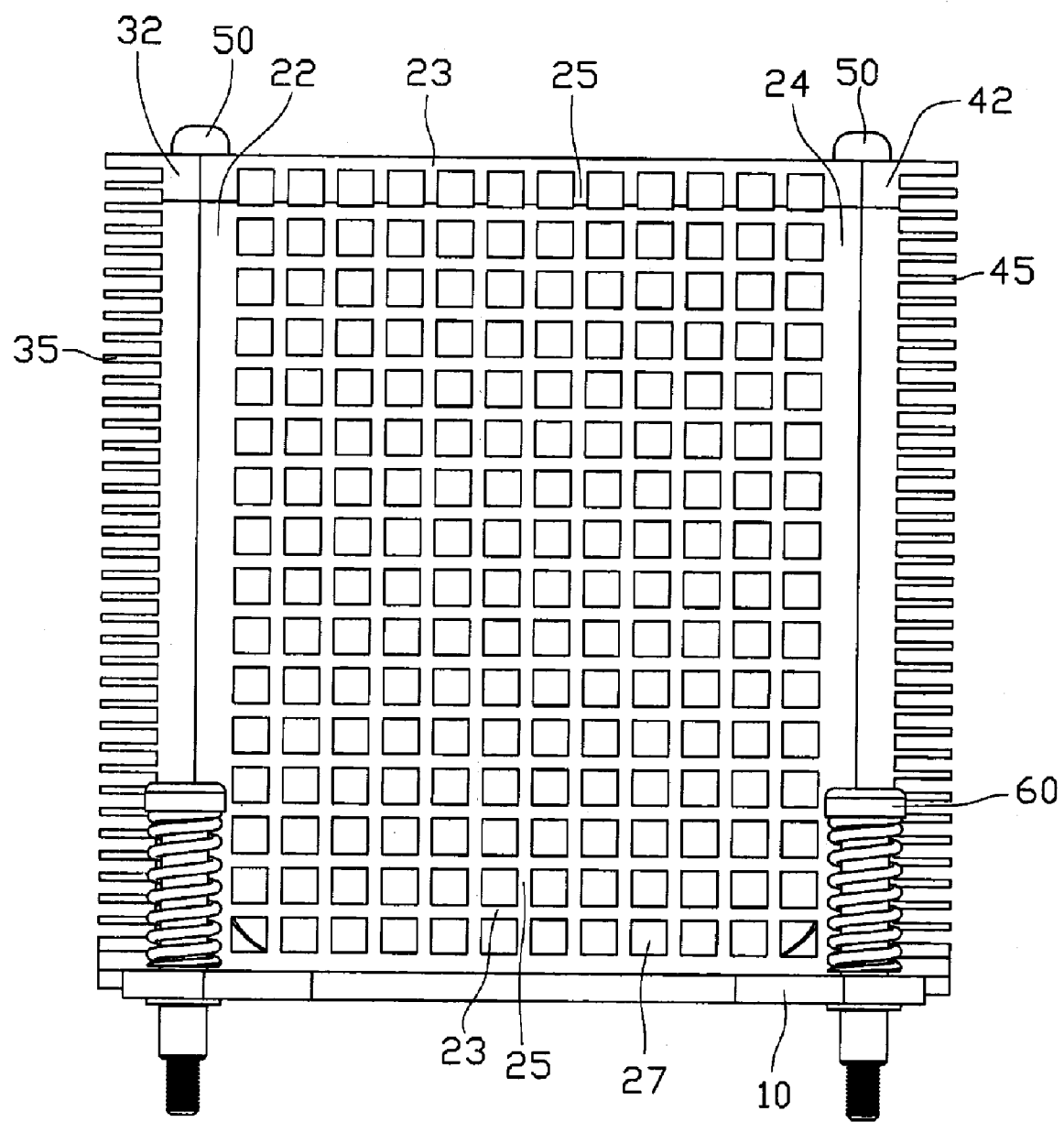
FIG. 2 is a front elevational view of FIG. 1.

Particularly referring to FIGS. 2-3, the heat dissipation member 20 comprises two parallel heat spreaders 22, 24 which are perpendicular to the base 10 and located at the two lateral sides of the heat dissipation member 20, a plurality of first heat-dissipating plates 23 which are parallel to the base 10 and connect the two heat spreaders 22, 24, and a plurality of second heat-dissipating plates 25 which are perpendicularly intercrossed with the first heat-dissipating plates 23 and located between the heat spreaders 22, 24. Each of the heat spreaders 22, 24 defines three grooves 29 in an outer lateral face thereof. The first heat-dissipating plates 23 are perpendicular to the heat spreaders 22, 24 and the second heat-dissipating plates 25 are parallel to the heat spreaders 22, 24. The first heat-dissipating plate 23 and the second heat-dissipating plate 25 therefore define a plurality of parallel air passages 27 between the two heat spreaders 22, 24 and each air passage 27 has two opposite ventilating ports, i.e., front and rear ventilating ports (not labeled) and a square cross section. Top and bottom ones of the heat-dissipating plates 23 and the two heat spreaders 22, 24 jointly form an outline border for the heat dissipation member 20. The first and second heat-dissipating plates 23, 25 are interweaved together. The air passages 27 are arranged as having a plurality of rows and columns in the heat dissipation member 20. The heat dissipation member 20, including the first and second heat-dissipating plates 23, 25 and the spreaders 22, 24 are integrally fabricated by metal extrusion.

The first heat sink 30 and the second heat sink 40 are constructed in the same manner. The first heat sink 30 comprises a conductive plate 32 connected with the heat spreader 22. The conductive plate 32 has a heat-absorbing face (not labeled) mating with the lateral face of the heat spreader 22 and a heat-dissipating face (not labeled) opposite to the heat-absorbing face. The heat-absorbing face of the conductive plate 32 defines three grooves 33 corresponding to the grooves 29 of the heat spreader 22. The grooves 29, 33 jointly form three channels in which the condensing portions 54 of the heat pipes 50 extend. The heat-dissipating face of the conductive plate 32 forms a plurality of first fins 35 extending laterally and outwardly, parallel to the base 10. The second heat sink 40 comprises a conductive plate 42 connected with the heat spreader 24. The conductive plate 42 has a heat-absorbing face (not labeled) mating with the lateral face of the heat spreader 24 and a heat-dissipating face (not labeled) opposite to the heat-absorbing face. The heat-absorbing face of the conductive plate 42 defines three grooves 43 corresponding to the grooves 29 of the heat spreader 24. The grooves 29 43 jointly form three channels in which the condensing portions 54 of the heat pipes 50 extend. The heat-dissipating face of the conductive plate 42 forms a plurality of second fins 45 extending laterally and outwardly, parallel to the base 10.

The two heat sinks 30 40 are connected with the heat dissipation member 20 by soldering and sandwich the heat dissipation member 20 therebetween. The condensing portions 54 of the heat pipes 50 are sandwiched between the conductive plates 32, 42 of the heat sinks 30, 40 and the heat spreaders 22, 24, respectively.

When the heat dissipation device applied to the heat-generating electronic device, the base 10 contacts the electronic device and absorbs heat therefrom. The heat is partly conducted to the bottom portion of the heat dissipation member 20 and travels upwardly. A majority of the heat is absorbed by the evaporating portions 52 of the heat pipes 50, travels along the heat pipe 50, and are transferred to the heat spreaders 22, 24 and the two heat sinks 30, 40 via the condensing portions 54 of the heat pipes 50 for being dissipated out by the heat dissipating plates 23, 25 and the fins 35, 45.

The first heat-dissipating plates 23 and the second heat-dissipating plates 25 of the dissipation member 20 are intercrossed with each other. Each first heat-dissipating plate 23 is anchored by a plurality of second heat-dissipating plates 25 that are intercrossed with the first heat-dissipating plate 23, so is each second heat-dissipating plate 25. So, the heat dissipation member 20 has a solid heat-dissipating plate structure. When a forced airflow passes through the heat dissipation member 20, noise and vibration is effectively diminished. On the other hand, the intercrossed heat-dissipating plate configuration avails to form an even and smooth heat distribution in the heat dissipation member 20. Utilization of the heat dissipation member 20 increases; accordingly heat dissipation performance of the heat dissipation device is enhanced.

In said embodiment of the present invention, the heat pipes 50 are sandwiched between the first and second heat sinks 30, 40 and the heat spreaders 22, 24 instead of extending through the heat dissipation member 20, which makes the heat dissipation device to be easily manufactured. A good heat-transferring between the heat pipes 50 and the heat dissipation member 20, the heat sinks 30, 40 can be established, accordingly, heat dissipation performance of the heat dissipation device is improved.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
   a base;
   a heat dissipation member comprising two heat-dissipating plate groups intercrossed with each other and defining a plurality of air passages, and two heat spreaders respectively located at two opposite sides of the heat-dissipating plate groups;
   a first heat sink and a second heat sink attached to two opposite sides of the heat dissipation member and contacting corresponding heat spreaders of the heat dissipation member; and
   a heat pipe connecting the base with the heat spreaders of the heat dissipation member and the first and second heat sinks to transfer heat from the base to the heat dissipation member and the first and second heat sinks.

2. The heat dissipation device as described in claim 1, wherein each of the heat-dissipating plate groups comprises a plurality of parallel heat-dissipating plates.

3. The heat dissipation device as described in claim 2, wherein the two heat spreaders of the heat dissipation member are parallel to each other, the heat-dissipating plate groups being crosswise arrayed between the heat spreaders.

4. The heat dissipation device as described in claim 3, wherein the two heat-dissipating plate groups are integrally formed with the heat spreaders.

5. The heat dissipation device as described in claim 3, wherein the first heat sink and the second heat sink are connected with the heat pipe and sandwich the heat dissipation member therebetween.

6. The heat dissipation device as described in claim 5, wherein the first heat sink and the second heat sink each comprise a conductive plate cooperating with a corresponding heat spreader to partly sandwich the heat pipe therebetween.

7. The heat dissipation device as described in claim 6, wherein the first and second heat sinks each further comprise a plurality of fins laterally extending from a corresponding conductive plate.

8. The heat dissipation device as described in claim 7, wherein the fins on the first and second heat sinks are parallel to each other and protrude on opposite sides of the heat dissipation device.

9. The heat dissipation device as described in claim 6, wherein the heat pipe has a U-shaped configuration and comprises an evaporating portion connected with the base and two condensing portions each substantially perpendicularly extending from one of opposite ends of the evaporating portion and sandwiched between the heat spreader and the conductive plate of a corresponding heat sink.

10. The heat dissipation device as described in claim 3, wherein the heat dissipation member comprises an outline border encircling the heat-dissipating plates.

11. The heat dissipation device as described in claim 1, wherein each of the air passages has a rectangular cross section and two opposite ventilating ports.

12. The heat dissipation device as described in claim 1, wherein the heat spreaders are substantially perpendicular to the base.

13. The heat dissipation device as described in claim 1, wherein the heat-dissipating plate groups comprise a plurality of first heat-dissipating plates which are substantially parallel to the heat spreaders, and a plurality of second heat-dissipating plates which substantially perpendicular to the first heat-dissipating plates.

14. The heat dissipation device as described in claim 1, wherein the base, the heat dissipation member, the first and second heat sinks are fabricated separately and combined together by soldering.

15. A heat dissipation device for dissipating heat from an electronic device comprising:
   a base for contacting the electronic device to absorb heat therefrom;
   two parallel heat spreaders substantially perpendicular to the base, with a plurality of intercrossed heat-dissipating plates located between and connecting with the heat spreaders;
   a heat pipe thermally connecting the base with the heat spreaders; and
   two heat sinks respectively cooperating with the heat spreaders, the heat sinks and the heat spreaders sandwiching the heat pipe therebetween.

16. The heat dissipation device as described in claim 15, wherein the heat pipe comprises an evaporating portion in connection with the base, and two condensing portions extending from the evaporating portion and sandwiched between the heat spreaders and heat sinks.

17. The heat dissipation device as described in claim 15 further comprising a plurality of additional heat-dissipating plates intercrossed with said heat-dissipating plates, and all the heat-dissipating plates jointly defining a plurality of air passages.

18. The heat dissipation device as described in claim 15, wherein each of the heat sinks comprises a conductive plate cooperating with a corresponding heat spreader and a plurality of fins extending outwards laterally from the conductive plate.

19. A heat dissipation device comprising:
   a heat dissipation member having front face, rear face opposite the front face, and two opposite lateral sides between the front and rear faces, a plurality of air passages being defined through the front and rear faces, the air passages being arranged as having a plurality of rows and a plurality of columns;
   a heat pipe having an evaporating portion thermally connected to a bottom of the heat dissipation member and two condensing portions thermally connected to the lateral sides of the heat dissipation member; and
   two heat sinks thermally and respectively contacting the two condensing portions of the heat pipe and the two lateral sides of the heat dissipation member;
   wherein the air passages of the heat dissipation member having the plurality of rows and the plurality of columns thereof are located between the two condensing portions of the heat pipe.

* * * * *